United States Patent [19]

Iwasawa et al.

[11] Patent Number: 4,825,102
[45] Date of Patent: Apr. 25, 1989

[54] MOS FET DRIVE CIRCUIT PROVIDING PROTECTION AGAINST TRANSIENT VOLTAGE BREAKDOWN

[75] Inventors: Toshiyuki Iwasawa, Tokyo; Masayoshi Miura, Kawasaki, both of Japan

[73] Assignee: Matsushita Electric Industrial Co., Ltd., Japan

[21] Appl. No.: 95,457

[22] Filed: Sep. 11, 1987

[30] Foreign Application Priority Data

Sep. 11, 1986 [JP] Japan .................. 61-214381
Nov. 12, 1986 [JP] Japan .................. 61-269054
Nov. 12, 1986 [JP] Japan .................. 61-269057

[51] Int. Cl.⁴ .................. H03K 17/08; H03K 17/16; H03K 17/284; H03K 3/013
[52] U.S. Cl. .................. 307/296.5; 307/443; 307/451; 307/558; 307/542
[58] Field of Search .................. 307/443, 585, 450, 451, 307/270, 279, 475, 452, 453, 542, 555, 558, 568, 576, 579, 264, 605, 592, 296.5, 234

[56] References Cited

U.S. PATENT DOCUMENTS

| | | | |
|---|---|---|---|
| 3,651,340 | 3/1972 | Cliff | 307/288 |
| 4,103,190 | 7/1978 | Beutler | 307/585 X |
| 4,164,842 | 8/1979 | Ebihara | 307/270 |
| 4,233,525 | 11/1980 | Takahashi et al. | 307/234 |
| 4,467,224 | 8/1984 | Maddox | 307/270 |
| 4,525,635 | 6/1985 | Gillberg | 307/234 X |
| 4,540,904 | 9/1985 | Ennis et al. | 307/270 |
| 4,620,310 | 10/1986 | Lvovsky | 307/270 X |

FOREIGN PATENT DOCUMENTS

| | | | |
|---|---|---|---|
| 53-86151 | 7/1978 | Japan . | |
| 54-32259 | 3/1979 | Japan . | |
| 0142061 | 11/1979 | Japan | 307/585 |
| 56-12128 | 2/1981 | Japan . | |
| 57-63861 | 4/1982 | Japan . | |
| 58-121829 | 7/1983 | Japan . | |
| 58-142626 | 8/1983 | Japan . | |

OTHER PUBLICATIONS

Electronic Design, 18th Apr. 1985, pp. 52, 53; D. Bursky: "CMOS ICs Handle High-Voltage Needs of RS-232 Interface".

Primary Examiner—Stanley D. Miller
Assistant Examiner—David R. Bertelson
Attorney, Agent, or Firm—Lowe, Price, LeBlanc, Becker & Shur

[57] ABSTRACT

A drive circuit suitable for producing a high voltage drive output signal has an output stage formed of a P-channel MOS FET (4) and an N-channel MOS FET (5) connected for push-pull operation. The circuit is configured such that even with a supply voltage applied to the output stage which is higher than the ON-state withstand voltage of the MOS FETs, this value of voltage is prevented from being applied to a MOS FET which is in the ON stage, i.e. by providing voltage-dropping resistors ($R_1$, $R_2$) connected between the drain electrodes of the MOS FETs (4, 5) or utilizing a circuit which prevents each MOS FET from entering the ON state until after the other MOS FET has entered the OFF state.

22 Claims, 10 Drawing Sheets

MOS FET DRIVE CIRCUIT PROVIDING PROTECTION AGAINST TRANSIENT VOLTAGE BREAKDOWN

BACKGROUND OF THE INVENTION

The present invention relates to a drive circuit based on MOS FETs which can be utilized in high-voltage applications such as vacuum discharge tubes, electroluminescence, ink jet printers, etc.

As a result of developments which have taken place in FET (field effect transistor) technology in recent years, MOS FETs have come into increasing use in high voltage drive circuits. Such circuits have been configured by directly replacing the bipolar transistors, used in the prior art for such circuits, by MOS FETs. In order to reduce the power consumption of such a drive circuit and improve the output waveform, a push-pull output stage of the form shown in FIG. 1 is generally utilized, based on a P-channel MOS FET 4 and an N-channel MOS FET 5. In FIG. 1, numeral 1 denotes an inverter, 2 and 3 are level shifters for shifting the level of the input signal to the appropriate respective gate input levels of the MOS FETs 4 and 5 which are connected in series between a high supply voltage $V_H$ and a low supply voltage $V_L$. The operation of this circuit will be described in conjunction with the timing chart of FIG. 2. Firstly, when the signal which is applied to the input of the inverter 1 (referred to in the following as the drive input signal) is at the "1" logic level, the output from the inverter 1 will be at the "0" logic level. Thus, the outputs from the level shifters 2 and 3 will be at the "0" logic level. On the other hand, the P-channel MOS FET 4 will be in the ON state at this time, while the N-channel MOS FET 5 will be in the OFF state. (In the following description and in the appended claims, the term "OFF" state of an FET has the significance of a condition of conduction between the drain and source electrodes of the FET, while the term "OFF" state of an FET has the significance of a condition of substantially non-conduction between the drain and source electrodes). As a result, the output from the drive circuit will be at the $V_H$ potential.

If the drive input signal goes to the "0" logic level, then the output from the inverter 1 will go to the "1" logic level, so that the output from the level shifters 2 and 3 will go to the "1" logic level. The P-channel MOS FET 4 is thereby set in the OFF state, while the N-channel MOS FET 5 is set in the ON state, so that the output from the drive circuit will be at the $V_L$ potential. It is necessary that the voltage difference ($V_H - V_L$) be lower than the OFF-state withstand voltage of each of the FETs 4 and 5.

In general, an ON-state drain-to-source withstand voltage and an OFF-state withstand voltage are separately specified for the type of FET utilized in such a high voltage drive application, with the ON-state withstand voltage being lower than then OFF-state withstand voltage. If the circuit is used in a status in which the applied voltage of the drive circuit ($V_H - V_L$) satisfies the condition:

ON-state withstand voltage<($V_H - V_L$)<OFF-state withstand voltage, (where "withstand voltage" of course denotes a minimum value of withstand voltage of the two FETs) then the following problem may arise for the drive circuit of FIG. 1. When the input signal changes from the "0" logic level to the "1" logic level, the P-channel MOS FET 4 changes from the OFF to the ON state, while the N-channel MOS FET 5 changes from the ON to the OFF state. Thus, at a certain instant, both FET 4 and FET 5 may be simultaneously in the ON state. At that instant, the applied voltage ($V_H - V_L$) will be higher than the ON-state withstand voltage, so that destructive voltage breakdown of FETs 4 and 5 may occur. A similar condition occurs when the input signal changes from the "1" logic level to the "0" logic level.

SUMMARY OF THE INVENTION

It is an objective of the present invention to overcome this problem of the prior art, by ensuring that even if a supply voltage which is higher than the ON-state withstand voltage of the FETs is applied to a drive circuit having a P-channel MOS FET and an N-channel MOS FET arranged in a push-pull circuit configuration, this will not result in destruction of the FETs due to voltage breakdown during a level transition of an applied signal.

In order to achieve the above objective, a first embodiment of a drive circuit according to the present invention comprises a push-pull circuit formed of a P-channel MOS FET and an N-channel MOS FET, and a pair of resistors connected in series between the respective source electrodes of the P-channel MOS FET and N-channel MOS FET.

A second embodiment of a drive circuit according to the present invention comprises a push-pull circuit formed of a P-channel MOS FET and an N-channel MOS FET, with a 2-input OR gate having the output thereof coupled to the gate electrode of the P-channel MOS FET and a 2-input AND gate having the output thereof coupled to the gate electrode of the N-channel MOS FET, one input terminal of the OR gate and one input terminal of the AND gate being each connected to receive a drive input signal and each of the other inputs of the OR gate and AND gate being connected to the output of the other one of the OR gate and AND gate.

A third embodiment of a drive circuit according to the present invention comprises a push-pull circuit formed of a P-channel MOS FET and an N-channel MOS FET, first delay circuit means connected to the gate electrode of the P-channel MOS FET for producing a fixed time delay between a rise in level of a drive input signal and a resultant fall in level of a signal applied to that gate electrode, and second delay circuit means connected to the gate electrode of the N-channel MOS FET for producing a fixed time delay between a fall in level of the drive input signal and a resultant rise in level of a signal applied to that gate electrode.

DESCRIPTION OF THE INVENTION

Figure 1:
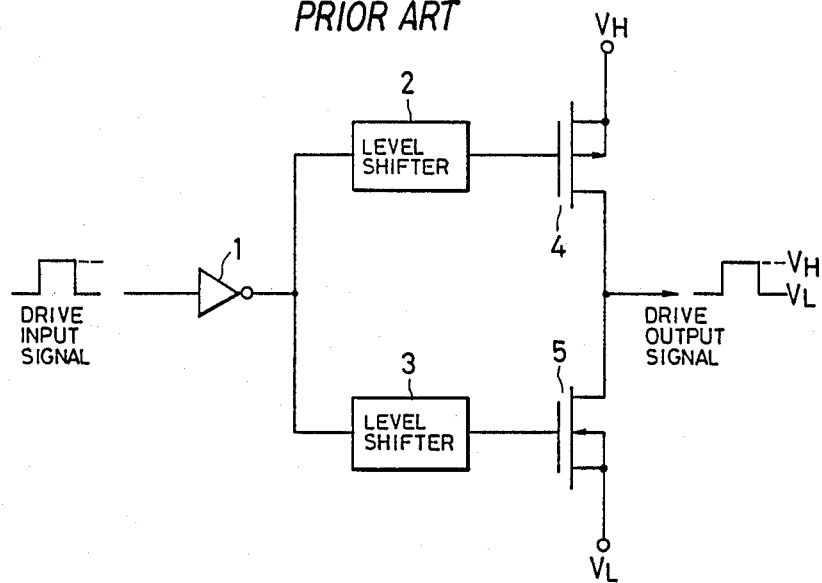
FIG. 1 is a circuit diagram of an example of a drive circuit according to the prior art.
Figure 2:
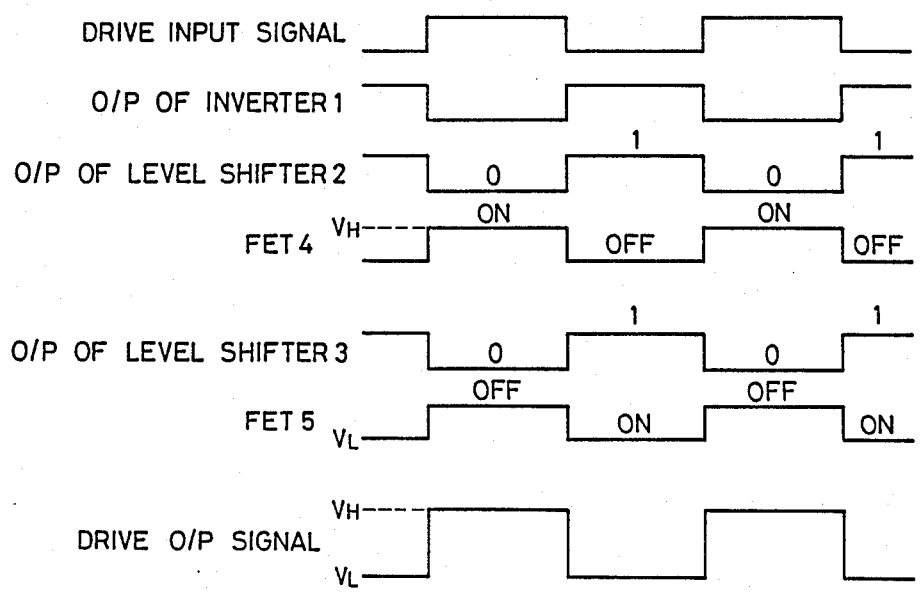
FIG. 2 is a timing chart for describing the operation of the circuit of FIG. 1.
Figure 3:
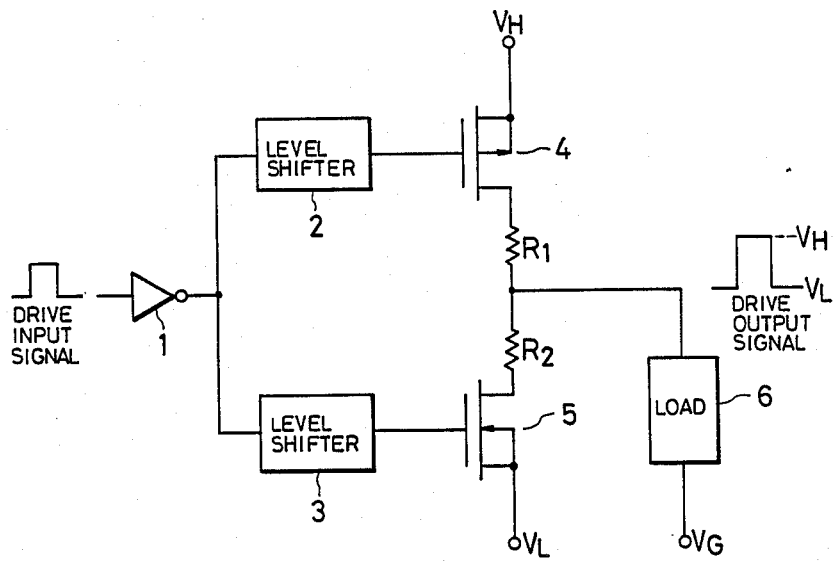
FIG. 3 is a circuit diagram of a first embodiment of a drive circuit according to the present invention.
Figure 4:
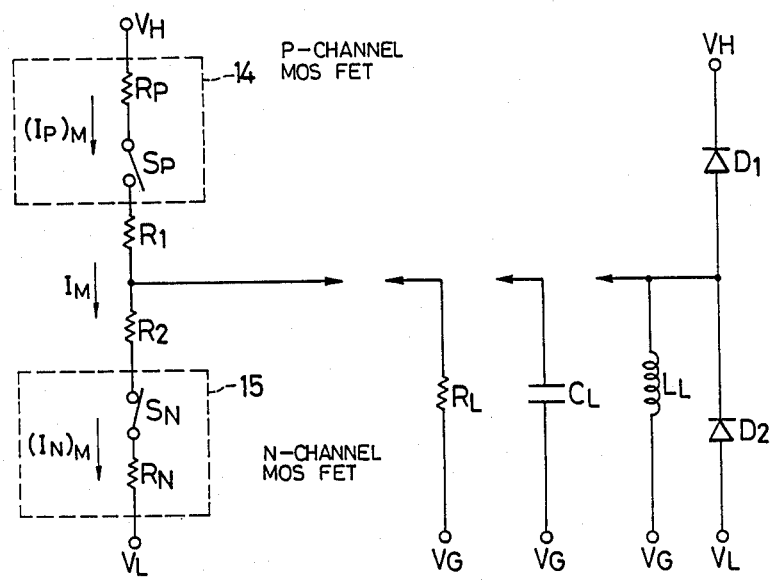
FIG. 4 is an equivalent circuit diagram of an output stage in the circuit of FIG. 3.

Embodiments of the invention will be described referring to the drawings. FIG. 3 is a circuit diagram of an output stage of a first embodiment of a drive circuit according to the present invention, and FIG. 4 is an equivalent circuit of the output transistors and load for the circuit of FIG. 3.

In FIG. 3, $V_H$ denotes a high supply voltage and $V_L$ a low supply voltage, with $(V_H-V_L)$ being the supply voltage of the output stage of the drive circuit. Numeral 1 denotes an inverter, 2 and 3 denote level shifters, 4 denotes a P-channel MOS FET and 5 an N-channel MOS FET. The following relationship is satisfied between the withstand voltage of the FETs 4 and 5 and the supply voltage $(V_H-V_L)$:

(ON-state withstand voltage) $<(V_H-V_L)<$ (OFF-state withstand voltage).

The level shifters 2 and 3 respectively serve to convert the level of the output signal from inverter 1 to appropriate gate input levels for the P-channel MOS FET 4 and N-channel MOS FET 5. $R_1$ and $R_2$ are resistors, respectively having one terminal connected to the source electrode of FET 4 and the source electrode of FET 5, and the other terminals thereof connected together to constitute an output terminal from which an output signal of the drive circuit is produced. 6 denotes a load, with one terminal thereof connected to the junction of resistors $R_1$ and $R_2$ and the other terminal thereof connected to a voltage $V_G$.

Referring to FIG. 4, numeral 14 denotes an equivalent circuit of the P-channel MOS FET 4 in FIG. 3, and 15 denotes an equivalent circuit for the N-channel MOS FET 5. $R_P$ and $R_N$ respectively denote the ON-state internal resistances of the FETs 4 and 5. $S_P$ and $S_N$ denote respective switches, and $(I_P)_M$ and $(I_N)_M$ denote respective peak currents of the FETs 4 and 5. $I_M$ is the smaller value of the currents $(I_P)_M$ and $(I_N)_M$. $R_L$ is the value of resistance of load 6, for the case when load 6 is resistive. $C_L$ is the capacitance of load 6 when the load is capacitive. $L_L$ is the inductance of load 6 when the load is inductive. $D_1$ and $D_2$ are diodes which are connected when an inductive load is applied, for voltage absorption, with the other terminals of the diodes being connected to the voltages $V_H$ and $V_L$ respectively.

During normal operation, as for the prior art example described above, the output signal goes to the $V_L$ potential when the input signal is at the "0" logic level, and goes to the $V_H$ value when the input signal is at the "1" logic level. During such normal operation, when one of the FETs is in the ON state, the other FET will be in the OFF state, so that the applied voltage $(V_H-V_L)$ is applied to the OFF-state FET, and destructive voltage breakdown of the ON-state FET cannot occur.

During a voltage transition condition, on the other hand, i.e. when the input signal changes from the 0 to the "1" logic level, or from the "1" to the "0" logic level, the P-channel MOS FET 4 and the N-channel MOS FET 5 may be instantaneously both in the ON state.

Generally speaking, it can be stated that for a MOS FET the following relationship is true:

(ON-state withstand voltage) $\geq$ (OFF-state withstand voltage)/2

Thus if it is ensured during such a transition condition that the value of resistor $R_1$ is higher than that of the internal resistance $R_P$ of the P-channel MOS FET, and the value of resistor $R_2$ is higher than that of the internal resistance $R_N$ of the N-channel MOS FET, then a voltage which is equal to or greater than ½ of the applied voltage $(V_H-V_L)$ will be developed across the resistors $R_1$ and $R_2$. As a result, although the FETs 4 and 5 are both momentarily set in the ON-state at the same instant during the transition, the effective applied voltage will be lower than the ON-state withstand voltage, so that destructive voltage breakdown will not occur.

In addition if the values of internal resistance $R_P$ and $R_N$ are each sufficiently low, then if $R_1$ and $R_2$ are selected such as to satisfy the following condition:

$$[(V_H-V_L)/(R_1+R_2+R_P+R_N)] \leq I_M \quad (1)$$

then most of the applied voltage $(V_H-V_L)$ will be developed across the resistors $R_1$ and $R_2$, so that destructive voltage breakdown of FETs 4 and 5 when these are in the ON state will not occur.

The operation will now be described for the case in which a load 6 is connected. Taking first the case of a resistive load $R_L$, the currents which flow through resistor $R_2$ and resistor $R_L$ respectively during a transition condition must be considered. $R_1$ and $R_2$ must be selected such as to satisfy the following relationship:

$$[((V_H-V_L)/(R_1+R_2+R_P+R_N)] + [(V_H-V_L)/(R_1+R_P+R_L)] \leq (I_P)_M \quad (2)$$

In this case, if $R_L > R_2$, $R_2$ then this relationship becomes identical to relationship (1) above.

Taking the case of a capacitive load $C_L$, the resistors $R_1$ and $R_2$ should be selected such as to satisfy both of the following relationships:

$$[((V_H-V_L))/(R_1+R_P)] \leq (I_P)_M,$$

$$[((V_H-V_L))/(R_2+R_N)] \leq (I_N)_M \quad (3)$$

If the value of $C_L$ is sufficiently small, then the load 6 can be considered to be a resistive load $R_L$, such as that shown in FIG. 4, and since $R_L > R_1$, $R_2$, the above relationship (1) will also apply in this case.

The case of an inductive load $L_L$ will now be considered. In general, diodes $D_1$ and $D_2$ will be connected to such an inductive load, so that the load can be considered as a resistive load $R_L$. In this case too, $R_1$ and $R_2$ should be selected to satisfy relationship (2) above.

With the described embodiment, as will be clear from the above, resistors $R_1$ and $R_2$ are connected between the P-channel MOS FET 4 and N-channel MOS FET 5 which constitute an output stage, whereby even if the applied voltage $(V_H-V_L)$ is such that:

(ON-state withstand voltage) $<(V_H-V_L)<$ (OFF-state withstand voltage) then destructive voltage breakdown will be prevented.

In the above embodiment, the input and output signals of the circuit are of the same phase, and inverter 1 is incorporated for this reason. However if the input and output signals are required to be of opposite phase, then inverter 1 can be omitted. Furthermore in the above description it is assumed that the gate input levels of FETs 4 and 5 are different. However if the gate input levels of these FETs are identical, then level shifters 2 and 3 can be omitted.

When the embodiment of the present invention described above is applied to an output circuit stage which uses a P-channel MOS FET and an N-channel MOS FET connected in push-pull configuration, resistors are connected symmetrically between the P-channel MOS FET and the N-channel MOS FET, such that the voltage which is developed across these resistors when both of the FETs are momentarily set in the ON state is sufficient to prevent destructive voltage breakdown of the FETs, even when a supply voltage is applied to the push-pull output stage constituted by the FETs which is higher than the ON-state withstand voltage of the FETs and lower than the OFF-state withstand voltage of the FETs.

Figure 5:
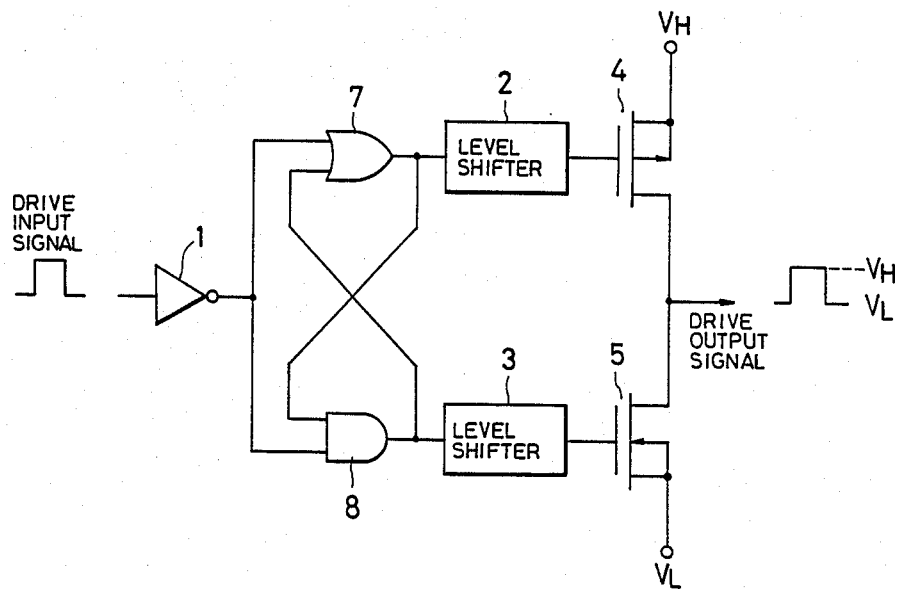
FIG. 5 is a circuit diagram of a second embodiment of a drive circuit according to the present invention.
Figure 6:
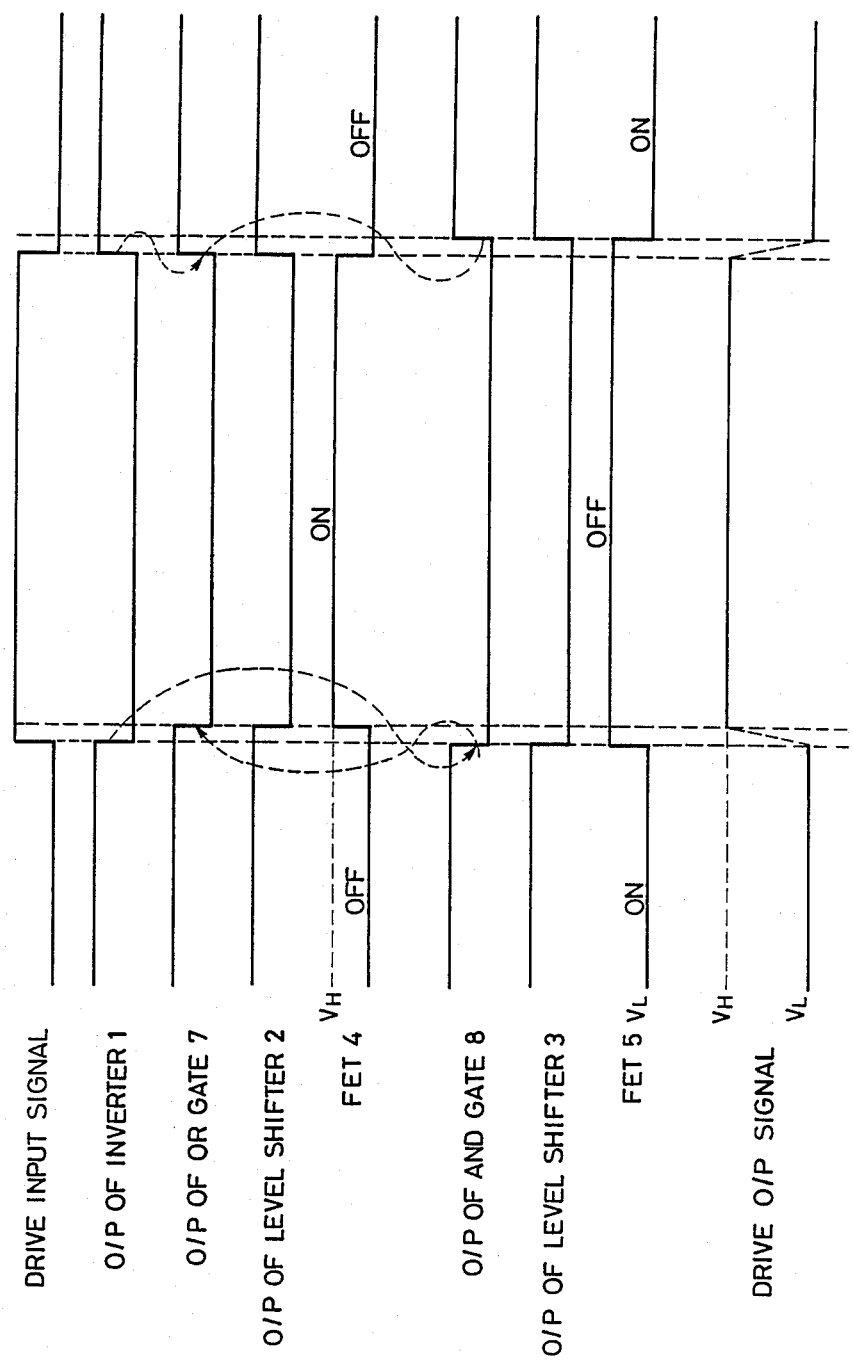
FIG. 6 is a timing chart for describing the operation of the circuit of FIG. 5.

FIG. 5 shows a second embodiment of the invention, while FIG. 6 is a timing chart for describing the operation of the circuit of FIG. 5. In FIG. 5, numeral 1 denotes an inverter, 2 and 3 denote level shifters, 4 denotes a P-channel MOS FET, and 5 denotes an N-channel MOS FET. 7 is an OR gate and 8 an AND gate. The rise-time and fall-time characteristics of FETs 4 and 5 are substantially identical. A high voltage $V_H$ is applied to the source electrode of FET 4 and a low voltage $V_L$ is applied to the source electrode of FET 5, with the voltages $V_H$ and $V_L$ being related to the withstand voltage characteristics of FETs 4 and 5 such that:

(ON-state withstand voltage)<$(V_H-V_L)$<(ON-state withstand voltage).

Assuming that the input signal is at the "0" logic level, then the output from the inverter 1 will be at the "1" logic level, and the output from OR gate 7 will be at the "1" logic level. Thus, the output from AN gate 8 will be at the "1" logic level. The level of the outputs thus produced from the OR gate 7 and AND gate 8 is shifted by the level shifters 2 and 3 to be applied to the gate electrodes of FETs 4 and 5, whereby the P-channel MOS FET 4 is in the OFF state and the N-channel MOS FET 5 is in the ON state. Thus, the output of the circuit is at the $V_L$ potential. If now the input signal changes from the "0" logic level to the "1" logic level, then the output from the inverter 1 will go from the "1" logic level to the "0" logic level, so that the output from AND gate 8 is unconditionally set to the "0" logic level. As a result, the output from the level shifter 3 sets the N-channel MOS FET 5 in the OFF state. Both of the inputs of the OR gate 7 are now at the "0" logic level, so that the output of OR gate 7 is at the "0" logic level, whereby the output of the level shifter 2 causes the P-channel MOS FET 4 to be in the ON state. The level shifters 2 and 3 have identical transfer characteristics, and in addition the rise and fall characteristics of the FETs 4 and 5 are also substantially identical. Thus, when the input signal changes from the "0" logic level to the "1" logic level, it is ensured that after the N-channel MOS FET 5 has changed to the OFF state, the P-channel MOS FET 4 goes to the ON state. In this way, the occurrence is prevented of a condition in which a voltage that is higher than the ON-state withstand voltage of the FETs is applied to a FET that is in the ON state, thereby ensuring that destructive voltage breakdown will not occur. This is illustrated by the timing chart of FIG. 6.

Considering now the case in which the input signal changes from the "1" logic level to the "0" logic level, the output of inverter 1 goes to the "1" logic level, so that the output from OR gate 7 unconditionally goes to the "1" logic level, and hence the output from level shifter 2 causes the P-channel MOS FET 4 to be set in the OFF state. On the other hand, since both of the inputs of AND gate 8 are at the "1" logic level, the output from AND gate 8 is at the "1" logic level, and hence the output from the level shifter 3 causes N-channel MOS FET 5 to be set in the ON state. Thus in this case also, it is ensured that after FET 4 has been set in the OFF state, the FET 5 is set in the ON state, so that destructive voltage breakdown of the FET that is set in the ON state cannot occur. This case is also illustrated by the timing chart of FIG. 6.

With the second embodiment of the invention described above, a 2-input OR gate 7 is connected to the input of a P-channel MOS FET 4 while a 2-input AND gate 8 is connected to the input of an N-channel MOS FET 5, with an inverted drive input signal being applied to one input of each of the OR gate and AND gate and with the other input of each OR gate and AND gate being connected to the opposing output. As a result, during a transition interval in which the input signal changes from the "0" logic level to the "1" logic level or from the "1" logic level to the "0" logic level, it is ensured that only after one FET has been changed from the ON to the OFF state will it become possible for the other FET to change from the OFF to the ON state. In this way, although a drive voltage is applied which is higher than the ON state withstand voltage and is lower than the OFF-state withstand voltage, destructive voltage breakdown of a FET which is in the ON state will not occur.

In the second embodiment described above, the input and output signals of the circuit are of the same phase, and inverter 1 is incorporated for this reason. However if the input and output signals are required to be of opposite phase, then inverter 1 can be omitted. Furthermore in the above description it is assumed that the gate input levels of FETs 2 and 3 are different. However if the gate input levels of these FETs are identical, then level shifters 2 and 3 can be omitted.

Figure 7:
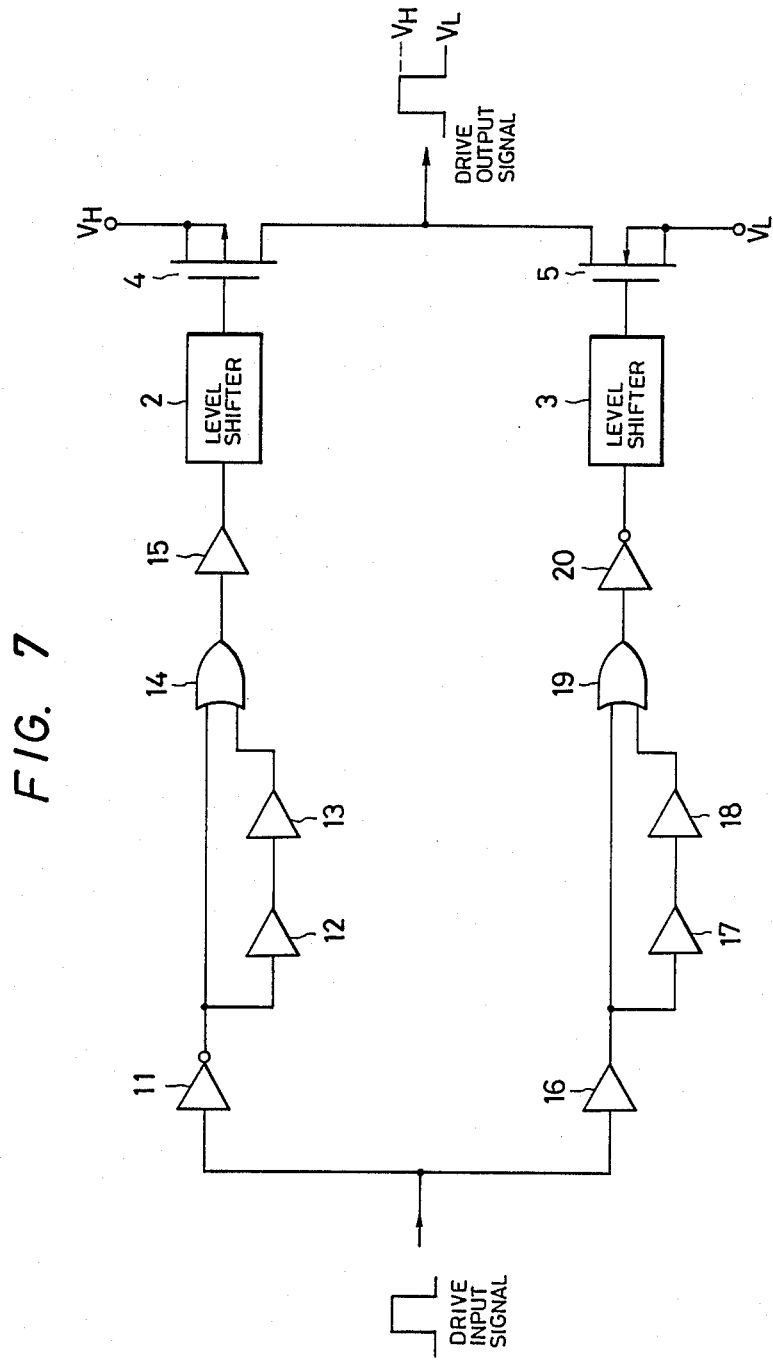
FIG. 7 is a circuit diagram of a third embodiment of a drive circuit according to the present invention.
Figure 8:
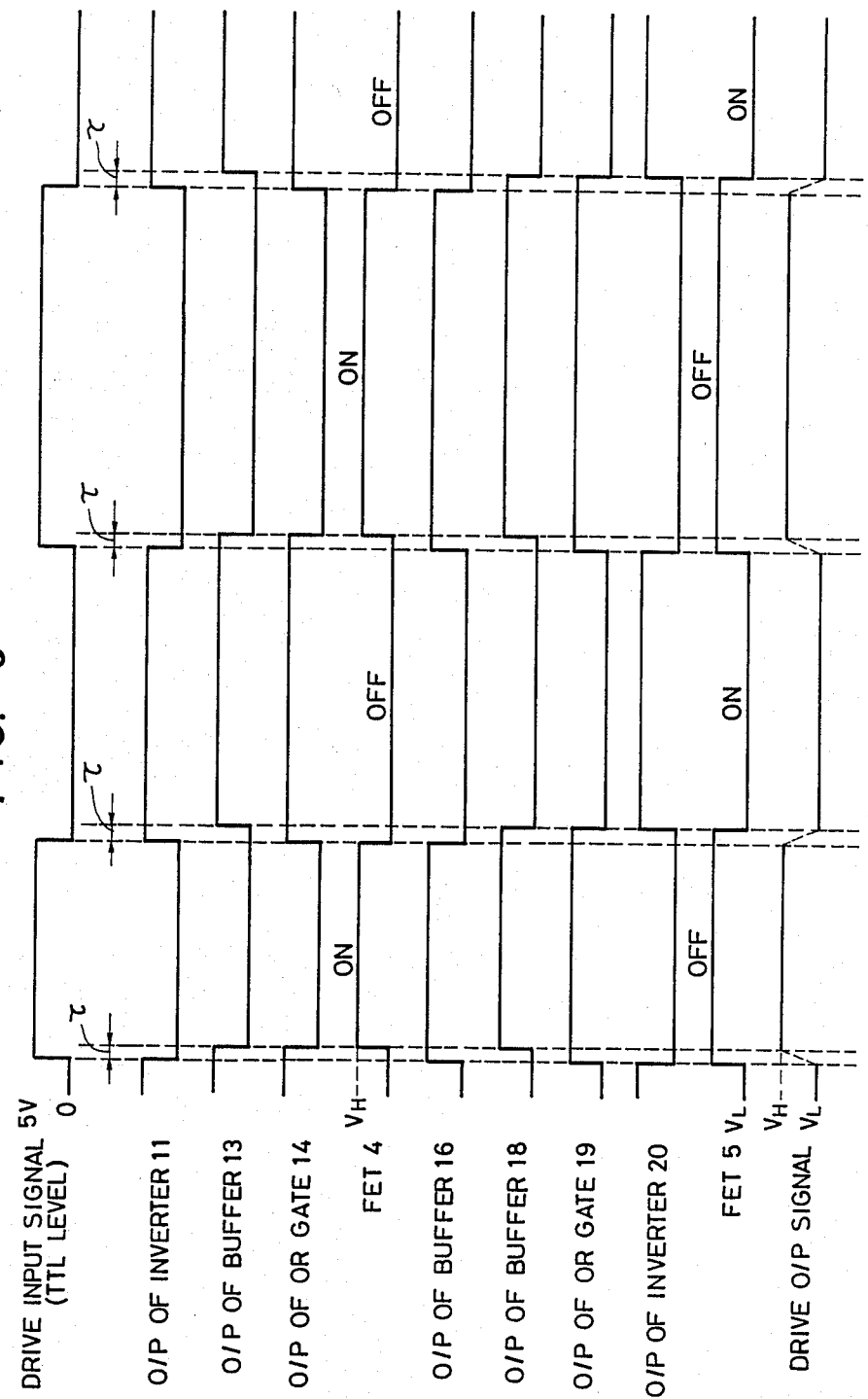
FIG. 8 is a timing chart for describing the operation of the circuit of FIG. 7.

FIG. 7 is a circuit diagram of a drive circuit according to a third embodiment of the present invention, and FIG. 8 is a timing chart for describing the circuit of FIG. 7. In FIG. 7, numerals 11 and 20 denote inverters, numerals 12, 13, 15, and 16 through 18 denote buffer circuits, 14 and 19 denote OR gates, 4 denotes a P-channel MOS FET, and 5 an N-channel MOS FET. The rise time and fall time characteristics of the FETs 4 and 5 are substantially identical. Numerals 2 and 3 denote level shifters, for shifting the level of an input signal to the gate input levels of FETs 4 and 5 respectively. $V_H$ denotes a high supply voltage and $V_L$ a low supply voltage, which are respectively applied to the source electrodes of the P-channel MOS FET 4 and N-channel MOS FET 5. $V_H$ and $V_L$ must be related to the withstand voltage of FETs 4 and 5 as follows:

(ON-state withstand voltage of FET)<$(V_H-V_L)$<(OFF-state withstand voltage of FET)

The operation of the circuit having the above configuration is as follows. Designating the signal transmission delay times of inverters 11 and 20 as $\tau_1$, and the signal transmission delay times of the buffer circuits 12, 13, 15 and 16 to 18 as $\tau_2$, and the delay times of the OR gates 14 and 19 as $\tau_3$, then generally speaking $\tau_1 \leq \tau_2 \leq \tau_3$. The signal transmission delay time of the level shifters 2 and 3 will be designated as $\tau_4$.

When the input signal changes from the "0" logic level to the "1" logic level, the output from the inverter 11 changes from the "1" logic level to the "0" logic level after a delay time $\tau_1$, so that the output from the buffer 13 is delayed by an amount $(\tau_1+2.\tau_2)$.

As a result, the output from OR gate 14 is delayed by an amount $(\tau_1+2\tau_2+\tau_3)$ before changing from the "1" logic level to the "0" logic level. Thus, the output from the level shifter 2 changes from the "1" logic level to the "0" logic level after a delay time of $(\tau_1+3\tau_2+\tau_3+\tau_4)$. On the other hand, the output from the OR gate 19 changes from the "0" logic level to the "1" logic level after a delay time of $(\tau_2+\tau_3)$ and the output from the inverter 20 changes from the "1" logic level to the "0" logic level after a delay time $(\tau_1+\tau_2+\tau_3)$. The output from the level shifter 3 therefore changes from the "1" logic level to the "0" logic level after a delay time of $(\tau_1+\tau_2+\tau_3+\tau_4)$. Thus, comparing the delay times of the outputs from the level shifters 2 and 3, the output from the level shifter 2 changes from the "1" logic level to the "0" logic level after a delay time of $2\tau_2$, that is to say when the input signal level changes from the "0" logic level to the "1" logic level, the FET 5 first changes from the ON to the OFF state, then after a delay time of $2\tau_2$ the FET 4 changes from the OFF to the ON state. In this way, FETs 4 and 5 do not attain the ON condition simultaneously.

The case of a change in level of the input signal from the "1" logic level to the "0" logic level will now be considered. In this case the output from the OR gate 14 changes from the "0" logic level to the "1" logic level after a delay time of $(\tau_1+\tau_3)$, and the output from the level shifter 2 therefore changes from the "0" logic level to the "1" logic level after a delay time of $(\tau_1+\tau_2+\tau_3+\tau_4)$. On the other hand, the output from OR gate 11 changes from the "1" logic level to the "0" logic level after a delay time of $(3\tau_2+\tau_3)$, and the output from the level shifter 3 changes from the "0" logic level to he "1" logic level after a delay time of $(\tau_1+3\tau_2+\tau_3+\tau_4)$. Comparing the delay times of the outputs from level shifters 2 and 3, the output from the level shifter 3 is delayed by an amount $2\tau_2$ with respect to the output from the level shifter 2, in changing from the "0" logic level to the "1" logic level. That is to say, after the input signal changes from the "1" logic level to the "0" logic level, the FET 4 first changes from the ON to the OFF state, then after a delay time of $2\tau_2$ the FET 5 changes from the OFF to the ON state. As a result, a condition is avoided whereby both of FETs 4 and 5 are simultaneously in the ON state.

Designating the delay amount $2\tau_2$ as $\tau$, and omitting all delay times other than those of the buffers 12 and 13 and buffers 17 and 18, the operation is as shown in the timing chart of FIG. 8. It is assumed that FETs 4 and 5 each have rise and fall times which are small by comparison with the value of $2\tau_2$.

With the third embodiment of the present invention, as will be clear from the above description, when the input signal changes from the "0" logic level to the "1" logic level or from the "1" logic level to the "0" logic level, it is ensured that the MOS FET which was in the ON state prior to this input signal transition is changed from the ON to the OFF state first, and thereafter following a fixed amount of time delay, the FET which was in the OFF state is changed from the OFF to the ON state. As a result, the circuit prevents the occurrence of a condition in which both of the FETs are in the ON state together during such an input signal transition. Thus, even if a voltage is supplied to the circuit such that:

(ON-state withstand voltage)$<(V_H-V_L)<$(OFF-state withstand voltage), destructive voltage breakdown of an FET which is in the ON state will not occur.

In the third embodiment of the present invention described above, pairs of buffers (i.e. buffers 12 and 3 and buffers 17 and 18) are used to establish delay times. However it would be equally possible to utilize single buffers rather than pairs or sets of 3 or more buffers.

Figure 9:
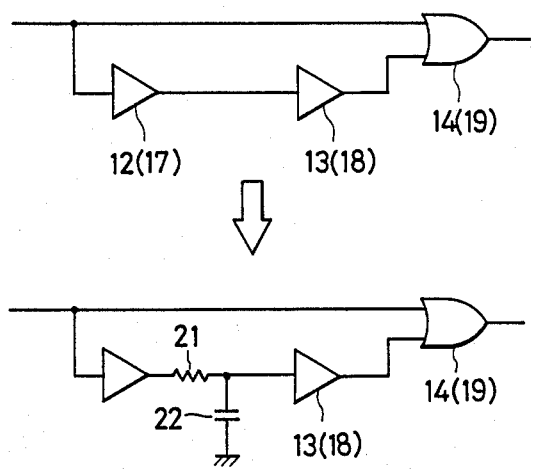
FIGS. 9 through 12 are circuit diagrams of fourth through seventh embodiments of the present invention.

If it is necessary to establish a relatively long delay time, due to large values of rise and fall times of the MOS FETs, then delay circuits each formed of a resistance-capacitance circuit can be inserted, e.g. between each pair of buffers 12, 13 and 17, 18. FIG. 9 illustrates a delay circuit for a fourth embodiment of the present invention, in which such a resistance-capacitance delay circuit is used to provide a substantially long value of delay time.

Figure 10:
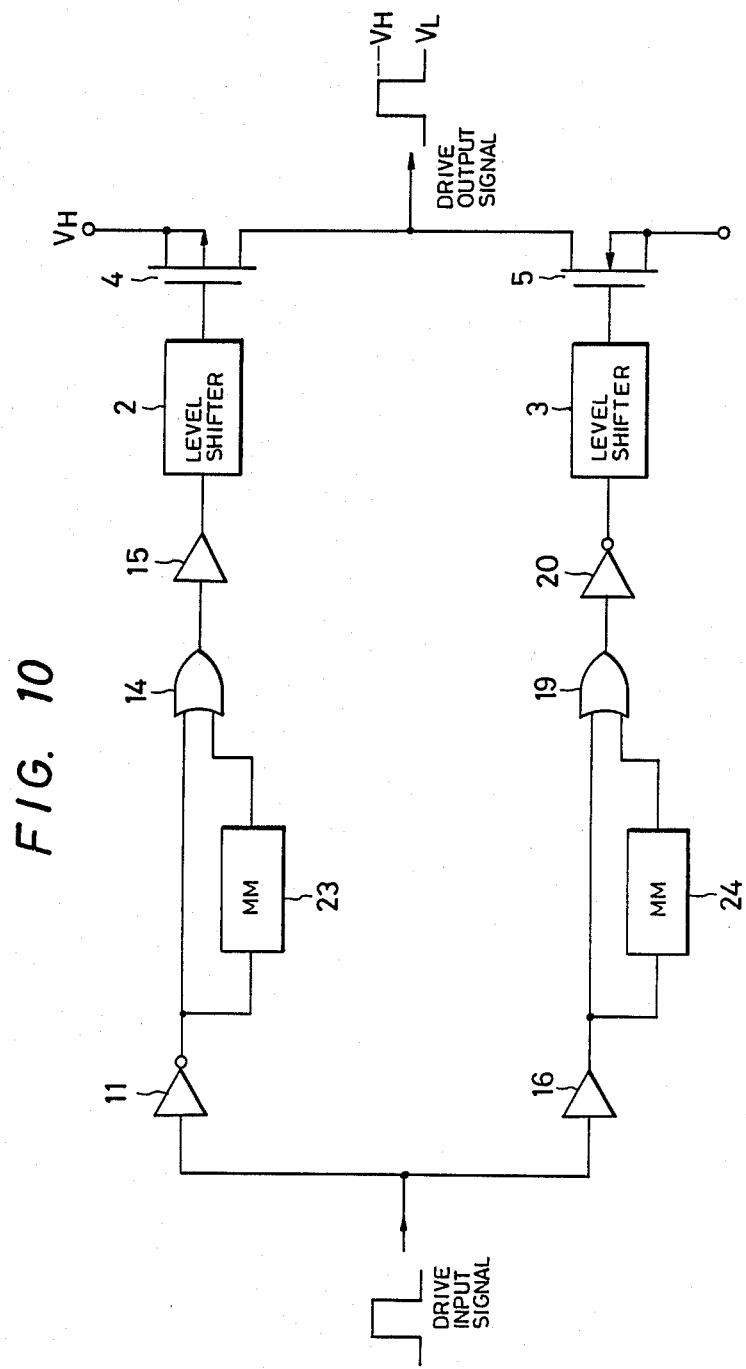

Alternatively, one-shot multivibrators may be utilized to provide a longer value of delay time, in place of the buffer circuits 12 13, and 17, 18. FIG. 10 shows a fifth embodiment of the present invention, in which this is done.

Figure 11:
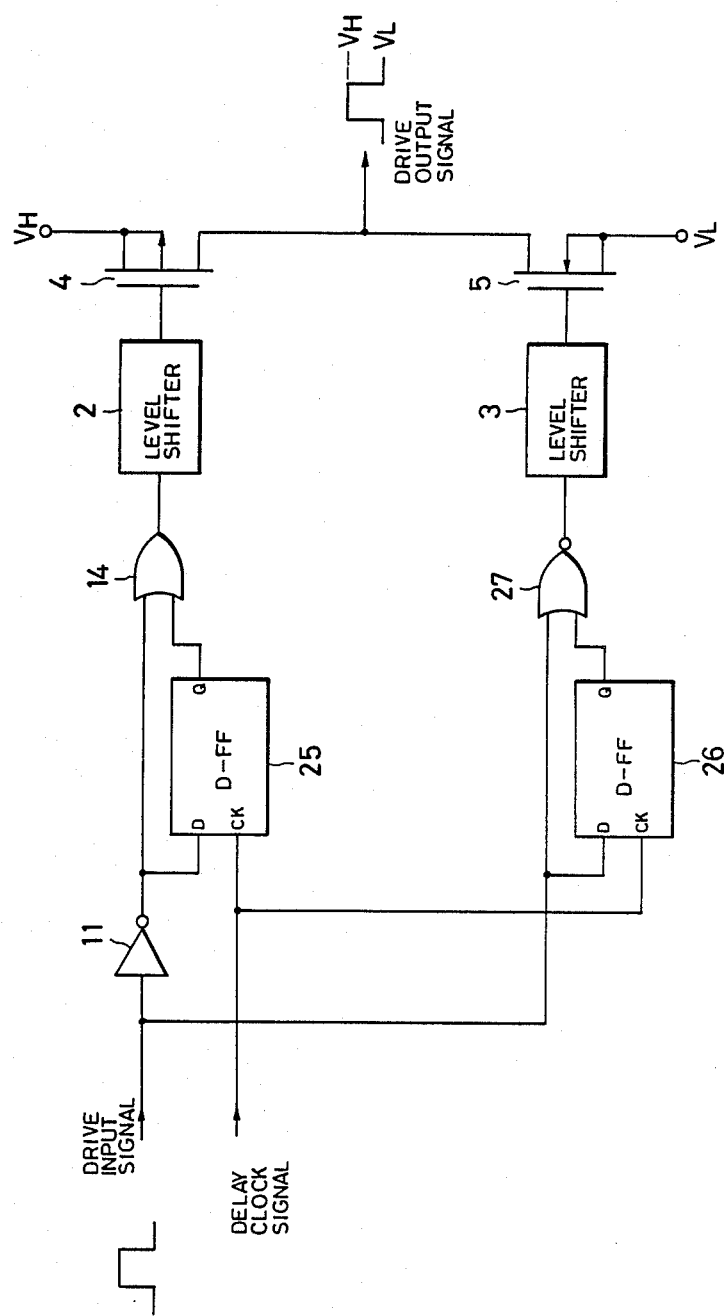
Figure 12:
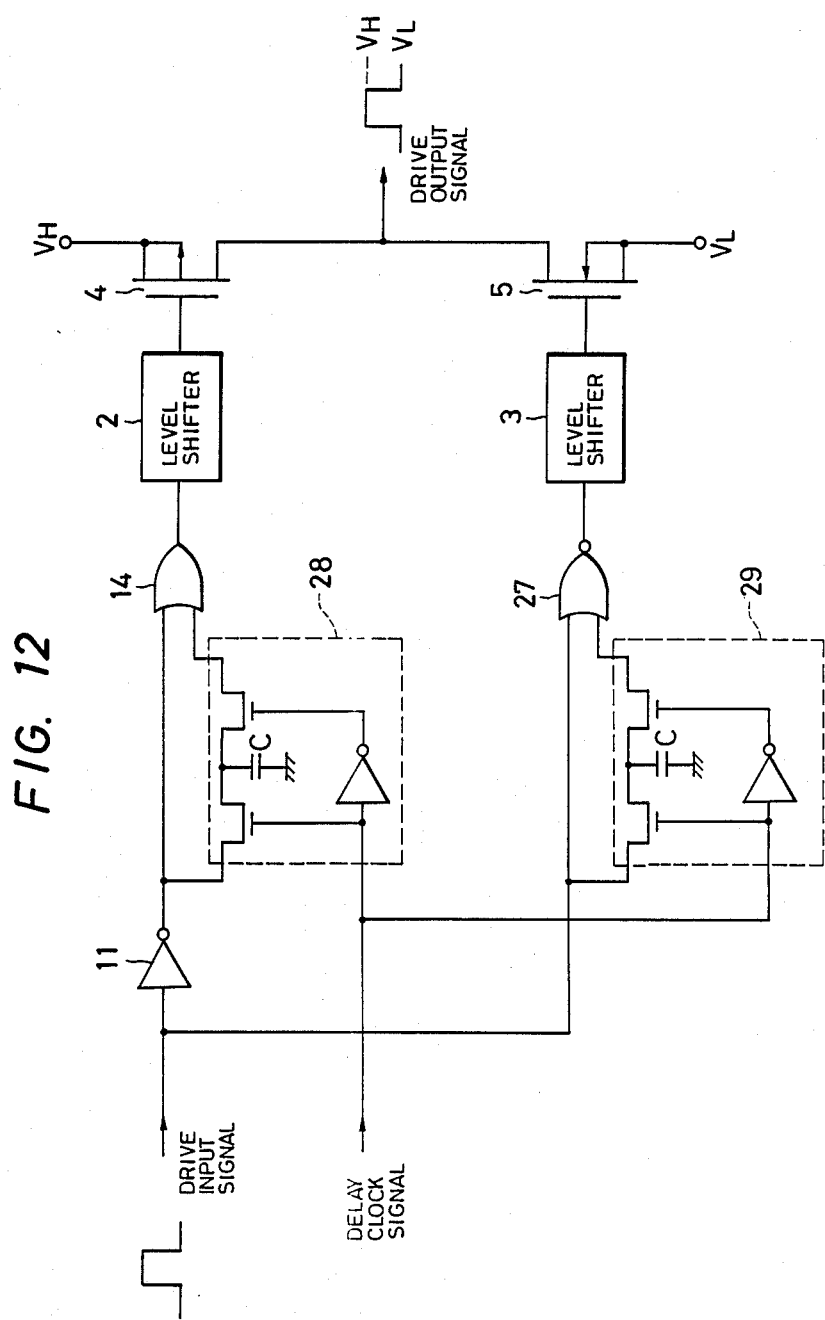

FIGS. 11 and 12 respectively show a sixth and a seventh embodiment of the present invention, in which delay circuits are utilized which operate on the basis of a clock signal. In the embodiment of FIG. 11, the delay circuit is formed of a data-type flip-flop 25, having a clock input terminal which is coupled to receive a clock signal, referred to in the following as the delay clock signal, from a clock signal source (not shown in the drawing), and a data terminal coupled to receive the inverted drive input signal from inverter 11. The Q output from D-type flip-flop 25 is applied to one input terminal of the OR gate 14 and the output from inverter 11 to the other input of OR gate 14. Similarly, a D-type flip-flop 26 is coupled to receive the delay clock signal and the drive input signal. The output from D-type flip-flop 26 is applied to one input terminal of a NOR gate 27, and the drive input signal to the other input of NOR gate 27, with the output from NOR gate 27 being applied to the input of level shifter 3. It will be apparent that the delay circuits thus formed between the stage of input of the input drive signal and the level shifters 2 and 3 will provide appropriate time delays as described hereinabove for the previous embodiments described referring to FIGS. 5 through 10, with the delay quantity $\tau'$ being equal to one period of the delay clock signal. In the embodiment of FIG. 12, a delay gate circuit 28 is controlled by a delay clock signal, and is coupled to receive the inverted input drive signal from inverter 11 and to apply an output signal to the OR gate 14. Such a delay gate circuit, based on a pair of FETs coupled to a capacitor C, and an inverter for applying gate input signals of mutually opposite phase to the FETs, is well known in the art and so detailed description will be omitted. A similar delay gate circuit 29 is coupled to receive the input drive signal and the delay clock signal, and applies an output signal to one input terminal of a NOR gate 27, while the input drive signal is applied to the other input of NOR gate 27. The output from NOR gate 27 is applied to level shifter 3. It will be apparent that the delay amount $\tau'$ (described hereinabove referring to FIG. 8) produced by this embodiment will be equal to one period of the delay clock signal.

The third to seventh embodiments of the present invention been described in the above for the case in which the input signal and output signal are of the same phase. If the phase of the output signal is to be inverted with respect to that of the input signal, then the inverter 11 could be replaced by a buffer, and buffer 16 replaced by an inverter. Furthermore in the description given above, it is assumed that the gate input levels of the P-channel MOS FET 4 and N-channel MOS FET 5 are mutually different. However if these input levels are the same, then level shifters 2 and 3 can be omitted.

With the third to seventh embodiments of the present invention described above, a push-pull circuit is utilized which is formed of a P-channel MOS FET 4 and an N-channel MOS FET 5, with input signals of identical logic level being applied to the gate electrodes of the P-channel MOS FET 4 and N-channel MOS FET 5, together with a circuit which produces a fixed delay before a rising edge of the drive input signal level is applied as a falling edge of the input signal of the gate electrode of the P-channel MOS FET, and a circuit which produces a fixed delay before a falling edge of the drive input signal is applied as a rising edge of the input signal of the gate electrode of the N-channel MOS FET. As a result, during a level transition of the input signal applied to the circuit, the timing at which the one of the P-channel MOS FET and N-channel MOS FET which was previously in the OFF state is changed to the ON state is delayed with respect to the timing at which the other FET is changed from the ON to the OFF state. In this way, a condition whereby both of the FETs are in the ON state simultaneously during such a transition is prevented. Thus, even if the supply voltage applied to the push-pull circuit is higher than the ON-state withstand voltage of the FETs and lower than the OFF-state withstand voltage of the FETs, destructive voltage breakdown of a FET which enters the ON state is prevented.

What is claimed is:

1. A drive circuit comprising a P-channel field effect transistor and an N-channel field effect transistor connected in a push-pull configuration, a first resistor having first and second terminals, said first terminal being connected to a drain electrode of said P-channel field effect transistor, said first resistor having a resistance value which is higher than an ON-state internal resistance value of said P-channel field effect transistor, a second resistor having first and second terminals, said first terminal of said second resistor being connected to a drain electrode of said N-channel field effect transistor, said second resistor having a resistance value which is higher than an ON-state internal resistance value of said N-channel field effect transistor, with the respective second terminals of said first and second resistors being mutually connected to form a junction which constitutes an output terminal of said drive circuit.

2. A drive circuit according to claim 1, in which a first supply voltage is applied to a source electrode of said P-channel field effect transistor and a second supply voltage is applied to a source electrode of said N-channel field effect transistor.

3. A drive circuit according to claim 2, in which a difference between said first and second supply voltages is greater than a smallest value of respective ON-state withstand voltages of said P-channel field effect transistor and N-channel field effect transistor, and is smaller than a smallest value of respective OFF-state withstand voltages of said P-channel field effect transistor and N-channel field effect transistor.

4. A drive circuit according to claim 1 in which, designating a smallest value of respective peak currents which flow in said P-channel field effect transistor and said N-channel field effect transistor as $I_M$, designating the respective resistance values of said first and second resistors as $R_1$ and $R_2$, and designating the value of ON-state internal resistance of said P-channel field effect transistor as $R_P$ and the value of ON-state internal resistance of said N-channel field effect transistor as $R_N$, the following relationship is satisfied:

$$[(V_H-V_L)/(R_1+R_2+R_P+R_N)] \leq I_M$$

5. A drive circuit according to claim 1 in which, designating a peak value of current which flows in said P-channel field effect transistor as $(I_P)_M$, designating a peak value of current which flows in said N-channel field effect transistor as $(I_N)_M$, the respectively values of said first and second resistors as $R_1$ and $R_2$, and designating the value of ON-state internal resistance of said P-channel field effect transistor as $R_P$ and the value of ON-state internal resistance of said N-channel field effect transistor as $R_N$, the following relationships are satisfied:

$$[(V_H-V_L)/(R_1+R_P)] \leq (I_P)_M$$

$$[(V_H-V_L)/(R_2+R_N)] \leq (I_N)_M$$

6. A drive circuit according to claim 1, and further comprising an inverter for inverting a drive input signal which is applied to said drive circuit, and level shifter means coupled to receive an inverted output signal produced from said inverter, for producing level-shifted output signals which are applied to the gate electrodes of said P-channel field effect transistor and N-channel field effect transistor.

7. A drive circuit comprising a push-pull output circuit formed of a P-channel field effect transistor and an N-channel field effect transistor, a two-input OR gate having an output terminal coupled to the gate input of the P-channel field effect transistor and a two-input AND gate having an output terminal coupled to the gate input of the N-channel field effect transistor, said OR gate and AND gate each having a first input terminal thereof coupled to receive a drive input signal and a second input terminal thereof coupled to the output terminal of the other one of said OR gate and AND gate.

8. A drive circuit according to claim 7, further comprising inverter means for inverting said drive input signal to produce an inverted drive input signal to be applied to said first input terminals of said OR gate and AND gate.

9. A drive circuit according to claim 7, further comprising level shifter means for executing level conversion of a output signal produced from said OR gate to supply a level-converted signal to the gate electrode of said P-channel field effect transistor and for executing level conversion of an output signal produced from said AND gate to supply a level-converted signal to the gate electrode of said N-channel field effect transistor.

10. A drive circuit comprising a P-channel field effect transistor and an N-channel field effect transistor connected in a push-pull configuration, and signal input circuit means for transferring a drive input signal to respective gate electrodes of said P-channel field effect transistor and N-channel field effect transistor as respective gate input signals of mutually identical logic level, said input circuit means comprising delay means for applying a fixed time delay between a logic level transition of said drive input signal and a corresponding level transition of the gate input signal of one of said field effect transistors which is in the ON state prior to said input signal logic level transition.

11. A drive circuit according to claim 10, in which said input circuit means functions such that following a transition of said drive input signal from a "1" logic level to a "0" logic level, a corresponding change in the gate input signal of said P-channel field effect transistor occurs after a fixed time delay, and such that following a transition of said drive input signal from the "0" logic level to the "1" logic level, a corresponding change in the gate input signal of said N-channel field effect transistor occurs after a fixed time delay.

12. A drive circuit according to claim 10, in which said delay means comprises at least one buffer circuit.

13. A drive circuit according to claim 10, in which said delay means comprises at least one circuit including a buffer element and a resistance-capacitance delay circuit coupled to said buffer element.

14. A drive circuit according to claim 10, in which said delay means comprises at least one monostable multivibrator.

15. A drive circuit according to claim 10, in which said delay means comprises at least one data-type flip-flop circuit.

16. A drive circuit according to claim 10, in which said delay means comprises at least one delay gate circuit which is controlled by delay clock pulses.

17. A drive circuit comprising a P-channel field effect transistor and a N-channel field effect transistor connected in a push-pull configuration, with respective drain electrodes of said P-channel field effect transistor and said N-channel field effect transistor being mutually connected through respective resistors.

18. A drive circuit comprising first and second MOS field effect transistors connected in a push-pull configuration, with output terminals of said first and second field effect transistors being mutually connected through respective impedance elements.

19. A drive circuit comprising a push-pull output circuit formed of a P-channel MOS FET and an N-channel MOS FET, a two-input OR gate having an output terminal coupled to the gate input of the P-channel MOS FET and a two-input AND gate having an output terminal is coupled to the gate input of the N-channel MOS FET, said OR gate and AND gate each having respective first inputs thereof mutually connected to receive in common a drive input signal and the other inputs thereof coupled to the output terminal of the other one of said OR gate and AND gate.

20. A drive circuit comprising a P-channel MOS FET and an N-channel MOS FET connected in a push-pull configuration, and signal input circuit means for transferring a drive input signal to respective gate electrodes of said P-channel MOS FET and N-channel MOS FET as respective gate input signals of mutually identical logic level, said input circuit means comprising delay means for applying a fixed time delay between a logic level transition of said drive input signal and a corresponding level transition of the gate input signal of one of said FETs which is in the ON state prior to said input signal logic level transition, and level shifter means for executing level conversion of a first output signal produced from said delay means to supply a level-converted signal to the gate electrode of said P-channel MOS FET and for executing level conversion of a second output signal produced from said delay means to supply a level-converted signal to the gate electrode of said N-channel MOS FET.

21. A drive circuit comprising a P-channel MOS FET and a N-channel MOS FET connected in a push-pull configuration, with respective drive electrodes of said P-channel MOS FET and said N-channel MOS FET being mutually connected through respective resistors and with an output signal of said drive circuit being obtained from a junction between said resistors, and level shifter means for executing level conversion of an input signal to supply a level-converted signal to the gate electrode of said P-channel MOS FET and for executing level conversion of said input signal to supply a level-converted signal to the gate electrode of said N-channel MOS FET.

22. A drive circuit comprising first and second MOS FETs connected in a push-pull configuration, with output terminals of said first and second MOS FETs being mutually connected through respective impedance elements, and with an output signal of said drive circuit being obtained from a junction between said impedance elements, and level shifter means for executing level conversion of an input signal to supply a level-converted signal to the gate electrode of said P-channel MOS FET and for executing level conversion of said input signal to supply a level-converted signal to the gate electrode of said N-channel MOS FET.

* * * * *